United States Patent [19]
Jang et al.

[11] Patent Number: 6,004,703
[45] Date of Patent: Dec. 21, 1999

[54] AMPLITUDE MASK AND APPARATUS FOR MANUFACTURING LONG PERIOD GRATING FILTER USING THE SAME

[75] Inventors: Joo-nyung Jang; Kyung-ho Kwack, both of Yongin; Bo-hun Choi, Seoul, all of Rep. of Korea

[73] Assignee: Samsung Electronics Co., Ltd., Kyungki-do, Rep. of Korea

[21] Appl. No.: 09/119,783

[22] Filed: Jul. 21, 1998

[30] Foreign Application Priority Data

Jul. 21, 1997 [KR] Rep. of Korea ............ 97 34112

[51] Int. Cl.$^6$ ........................................ G03F 9/00
[52] U.S. Cl. ........................................ 430/5
[58] Field of Search ............... 430/5, 22, 322; 378/35

[56] References Cited

U.S. PATENT DOCUMENTS 5,133,990  7/1992  Fleischmann et al. ............ 430/5

FOREIGN PATENT DOCUMENTS

| | | |
|---|---|---|
| 62-500052 | 1/1987 | Japan . |
| 5-502951 | 5/1993 | Japan . |
| 6-230298 | 8/1994 | Japan . |
| 9-113741 | 5/1997 | Japan . |

*Primary Examiner*—S. Rosasco
*Attorney, Agent, or Firm*—Leydig, Voit & Mayer, Ltd.

[57] ABSTRACT

An amplitude mask used in a long period grating filter manufacturing apparatus includes a metal substrate having a periodic transmission area having a period for selectively transmitting light and a non-transmission area through which light does not pass; and a piezo-electric transducer located on the non-transmission area of the metal substrate for changing the period of the periodic transmission area. The periodic transmission area is located in the middle of the metal substrate and the piezo-electric transducer is located on opposite sides of the periodic transmission area. Piezo-electric transducers may be located on the non-transmission area to vary the period of the periodic transmission area.

6 Claims, 3 Drawing Sheets

AMPLITUDE MASK AND APPARATUS FOR MANUFACTURING LONG PERIOD GRATING FILTER USING THE SAME

BACKGROUND OF THE INVENTION

1. Field of the Invention

The present invention relates to an optical passive device, and more particularly, to an amplitude mask and an apparatus for manufacturing a long period grating filter using the same.

2. Description of the Related Art

Recently, with the development of optical communications, the long period grating filter is arousing much interest as an optical passive device. The long period grating filter is a device for coupling light propagating in the core of an optical fiber to a cladding mode. The long period grating filter is manufactured by periodically changing the refractive index of the core of an optical fiber sensitive to ultraviolet rays. Namely, the refractive index increases in the part exposed to light and does not change in the part not exposed to light. Accordingly, the refractive index periodically changes. The following Equation 1 must be satisfied in order to couple light in a core mode to the cladding mode.

$$\beta_{co} - \beta_{cl}^n = \frac{2\pi}{\Lambda} \qquad \text{[EQUATION 1]}$$

wherein, $\beta_{co}$, $\beta_{cl}^n$, and $\Lambda$ respectively denote a light propagation constant of the core mode, a light propagation constant of an n degree cladding mode, and a grating period.

In Equation 1, when $2\pi n/\lambda$ (n is a refractive index, and $\lambda$ is a wavelength) is substituted for $\beta$, $n_{co}-n_{cl}=N\Lambda$ is obtained. Here, $n_{co}$ is a refractive index of the core, and $n_{cl}$ is a refractive index of the cladding in an optical fiber. Therefore, in order to change light having a particular wavelength into a cladding mode, the period $\Lambda$ and the refractive index difference $n_{co}-n_{cl}$ are to be defined. The refractive index difference can be obtained by appropriately exposing the ultraviolet sensitive optical fiber to ultraviolet laser light.

The apparatus for manufacturing the long period grating filter by irradiating with an ultraviolet laser light will be described.

FIG. 1 schematically shows a conventional apparatus for manufacturing a long period grating filter.

In detail, the conventional apparatus for manufacturing the long period grating filter includes a high-output excimer laser light source 1 for emitting UV laser light, a mirror 3 for changing the path 2 of the laser light emitted from the excimer laser light source 1, a lens 5 for controlling the focus of the laser light changed in direction by the mirror 3, a silica mask 7 for selectively transmitting the laser light which has passed through the lens, and an optical fiber 9 for forming the long period grating in the core by irradiation with the laser light which has passed through the silica mask 7.

In a process of manufacturing the long period grating filter using the manufacturing apparatus shown in FIG. 1, the laser light irradiates the optical fiber 9 which contacts the silica mask 7 through the lens 5. At this time, the laser light irradiates the optical fiber 9, thus forming a long period grating having a different refractive index. It is possible to obtain a desired long period grating filter by transmitting light through the optical fiber 9 using the light source 11 and detecting light with a detector 13.

In the above-mentioned apparatus for manufacturing the long period grating filter, the silica mask 7 is formed using a chrome pattern obtained by coating a silica substrate with chrome and patterning the chrome. Therefore, the laser light is selectively transmitted by the chrome pattern. However, since the damage threshold of the chrome pattern is low, i.e., 100 mJ/cm², it is not possible to effectively use the high-output excimer laser light. Further, since the silica mask is manufactured by forming the chrome pattern on the silica substrate, the silica mask has only one period.

SUMMARY OF THE INVENTION

It is an objective of the present invention to provide a new mask which can solve the above-mentioned problems of the silica mask.

It is another objective of the present invention to provide an apparatus for manufacturing a long period grating filter using the new mask.

To achieve the first objective, there is provided an amplitude mask used for a long period grating filter manufacturing apparatus, comprising a metal substrate having a transmission area having a period for selectively transmitting light and a non-transmission area through which the light does not pass; and a piezo-electric transducer on the non-transmission area of the metal substrate for changing the period of the transmission area. The transmission area is located in the middle of the metal substrate and the piezo-electric transducer is located above and below the transmission area. The plurality of piezo-electric transducers are located on the non-transmission area to vary the period of the transmission area.

To achieve the second objective, there is provided an apparatus for manufacturing a long period grating filter, comprising a light source, a lens for controlling the focus of the light emitted from the light source, and an amplitude mask selectively irradiating the light which has passed through the lens on an optical fiber in which a long period grating is formed, wherein the amplitude mask comprises a transmission area having a period to selectively transmit the light and a non-transmission area through which the light does not pass on the metal substrate. A piezo-electric transducer is located on the non-transmission area, thus changing the period of the transmission area. The transmission area is located in the middle of the metal substrate and the piezo-electric transducer is located on opposite sides of the transmission area. A plurality of piezo-electric transducers are located in the non-transmission area to vary the period of the transmission area.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

Hereinafter, a preferred embodiment of the present invention will be described with reference to the attached drawings. However, many variations are possible within the scope and spirit of the present invention and the present invention is not restricted to the following embodiments. The embodiments of the present invention are provided in order to completely explain the present invention to one skilled in the art.

Figure 1:
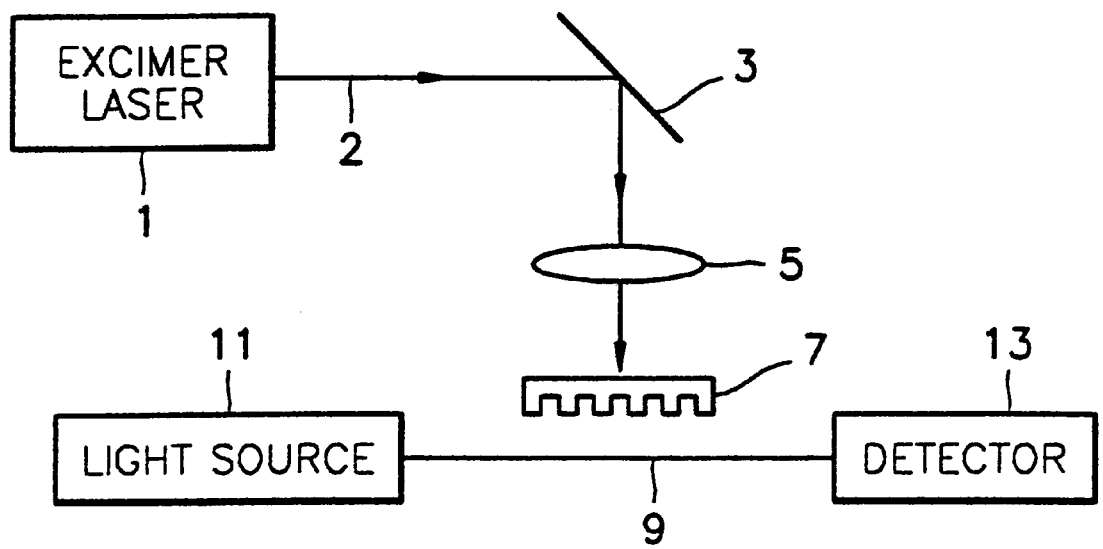
FIG. 1 schematically shows a conventional apparatus for manufacturing a long period grating filter.
Figure 2:
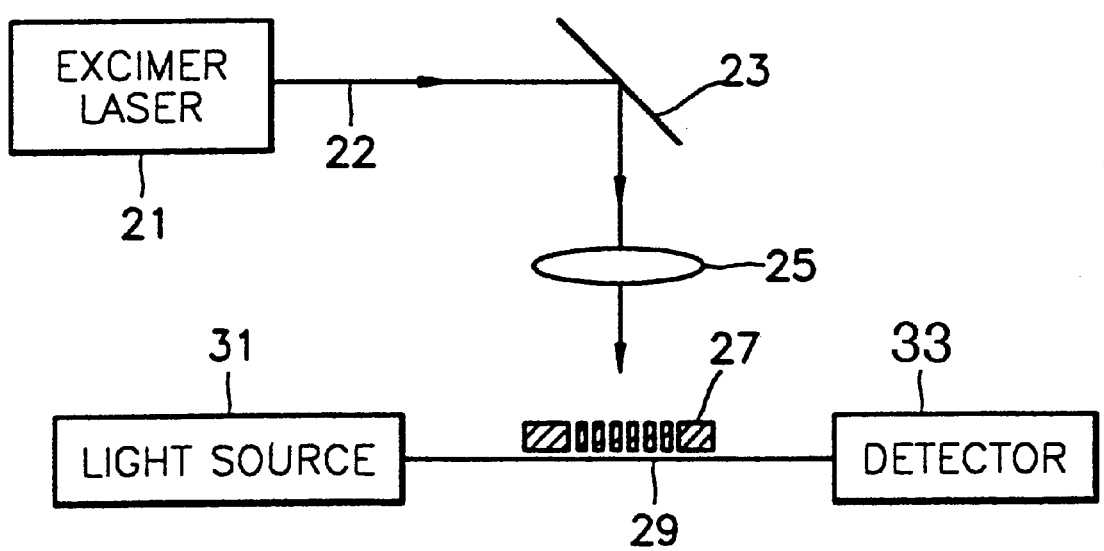
FIG. 2 schematically shows an apparatus for manufacturing a long period grating filter according to the present invention.
Figure 3:
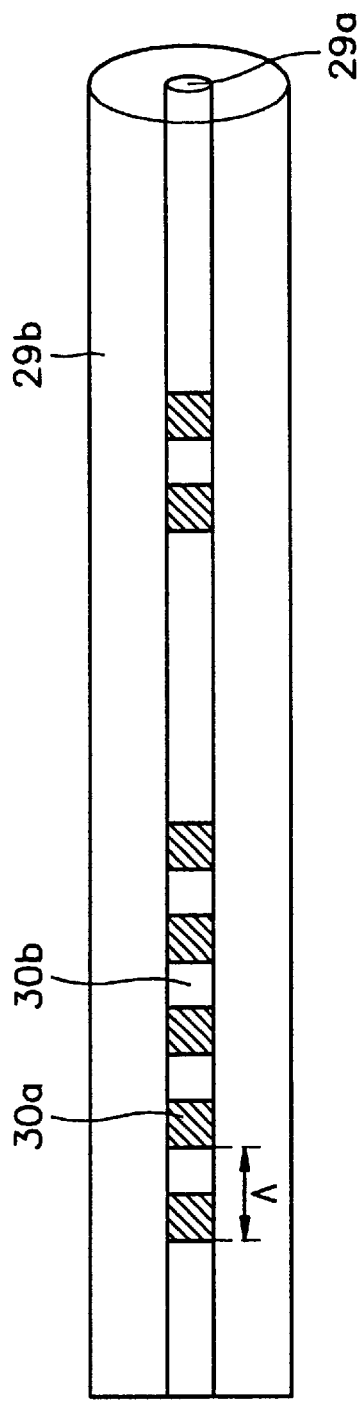
FIG. 3 schematically shows a long period grating filter manufactured by the long period grating filter manufacturing apparatus of FIG. 2.

FIG. 2 schematically shows the long period grating filter manufacturing apparatus according to the present invention. FIG. 3 schematically shows the long period grating filter manufactured using to the long period grating filter manufacturing apparatus of FIG. 2.

In detail, the long period grating filter manufacturing apparatus according to the present invention includes an excimer laser light source 21, a mirror 23 for changing the path 22 of the laser light emitted from the excimer laser light source 21, a lens 25 for controlling the focus of the laser light whose path 22 changed by the mirror 23, an amplitude mask 27 for selectively transmitting the laser light which has passed through the lens 25, and an optical fiber 29 for forming the long period grating in the core by irradiation with the laser light which has passed through the amplitude mask 27. The excimer laser light source 21 emits the light in the ultraviolet region of the light spectrum. The optical fiber 29 is sensitive to light in ultraviolet region.

In a process of manufacturing the long period grating filter using the long period grating filter manufacturing apparatus shown in FIG. 2, the laser light is transmitted through a lens 25 and irradiates the optical fiber 29 which contacts a metal mask 27. At this time, the laser light irradiates the optical fiber 29, thus forming a long period grating having a different refractive index and a particular period in a core layer 29a, as shown in FIG. 3. In FIG. 3, reference numerals 29b, 30a, and 30b respectively denote a cladding layer, an area irradiated by light the laser and an area not irradiated by the laser light.

When the period of the long period grating is $\Lambda$ and $\lambda_1$ meets the condition of $n_{co}-n_{cl} = \lambda_1/\Lambda$, the outputs of are obtained according to the inputs of $\lambda_1', \lambda_2, \lambda_3, \ldots$ (The change from $\lambda_1$ into $\lambda_1'$ means that the output varies. Therefore, it is possible to obtain a desired long period grating filter by transmitting light through the optical fiber 29 using a light source 31 and detecting light with a detector 33.

Figure 4:
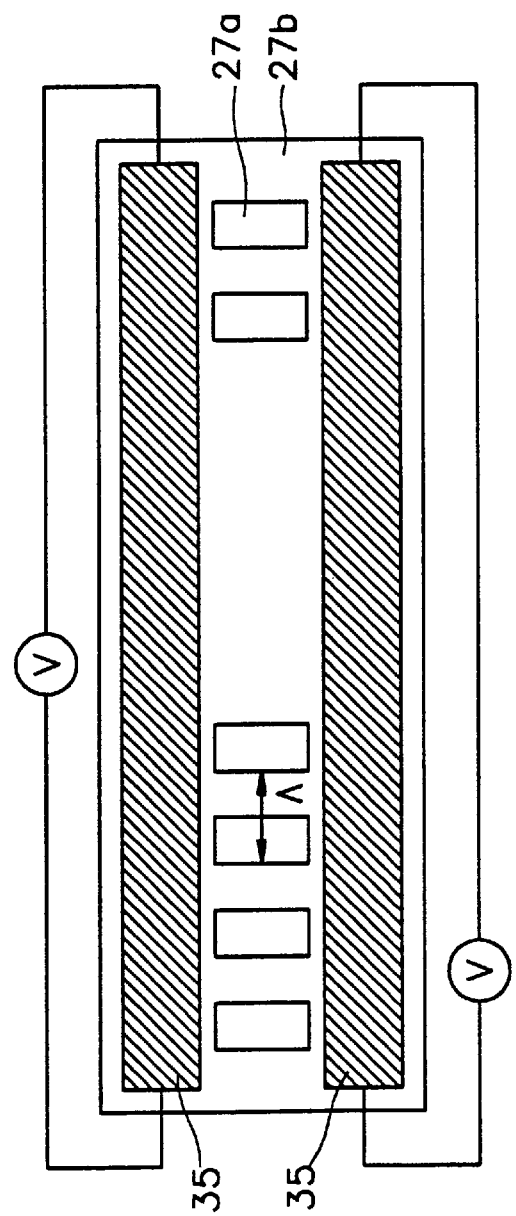
FIG. 4 is a plan view showing an enlarged example of an amplitude mask which can be applied to the long period grating filter manufacturing apparatus of FIG. 2.

FIG. 4 is a plan view showing an enlarged example of an amplitude mask which can be applied to the long period grating filter manufacturing apparatus of FIG. 2.

To be specific, the amplitude mask 27 includes a metal substrate, such as a stainless steel substrate. The metal substrate is comprised of a transmission area 27a which can transmit light and has a period $\Lambda$ of several hundreds of $\mu$m, for example, 200 through 500 $\mu$m, and a non-transmission area 27b. The transmission area 27a is produced using a $CO_2$ laser. In particular, a piezo-electric transducer 35 is present on the non-transmission area 27b, above and below the transmission area 27a. The piezo-electric transducer 35 can control the period of the amplitude mask 27 since a voltage can be applied to both sides.

Here, a transmission spectrum according to the change in period when a voltage is applied to the piezoelectric transducer and when a voltage is not applied to the piezo-electric transducer will be described.

Figure 5:
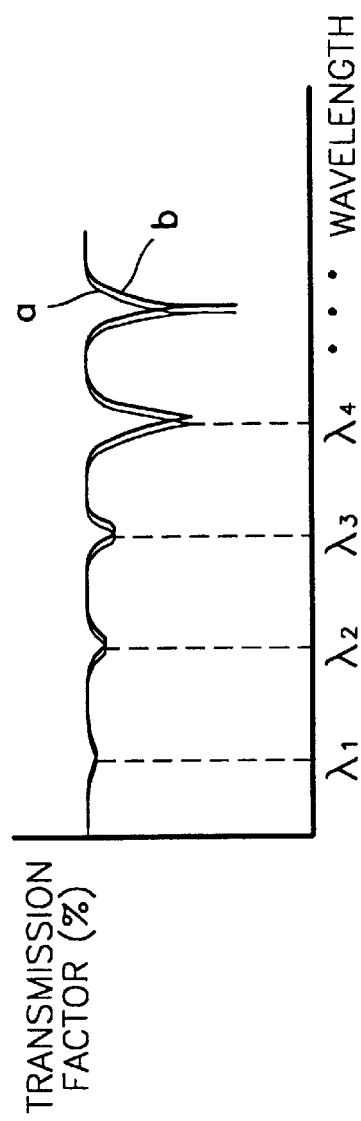
FIG. 5 is a graph showing a transmission spectrum of the long period grating filter of FIG. 2.

FIG. 5 is a graph showing the transmission spectrum of the long period grating filter of FIG. 2.

First, the period when a voltage is not applied to the piezo-electric transducer is $\Lambda$, so a coupled wavelength must meet the above-mentioned condition, i.e., $n_{co}-n_{cl}=N\Lambda$. In other words, since $n_{cl}$ has the values of $n_{cl}^1, n_{cl}^2, n_{cl}^3, \ldots$, the coupled wavelength has the values of $\lambda_1, \lambda_2, \lambda_3, \ldots$ Accordingly, the transmission spectrum is shown by reference numeral "a".

Next, when the period is changed by as much as $\Lambda$ by applying a voltage to the piezo-electric transducer, the coupled wavelength meets the above-mentioned condition, i.e., $n_{co}-n_{cl}=\lambda'/(\Lambda+\Delta\Lambda)$. In other words, since the wavelength $\lambda'$ is moved as much as $\Delta\lambda(n_{co}-n_{cl})$ from $\lambda$, the transmission spectrum is shown by the plot indicated by reference numeral "b". In the amplitude mask used for the long period grating filter manufacturing apparatus according to the present invention, it is possible to select the particular wavelength to be coupled.

Figure 6:
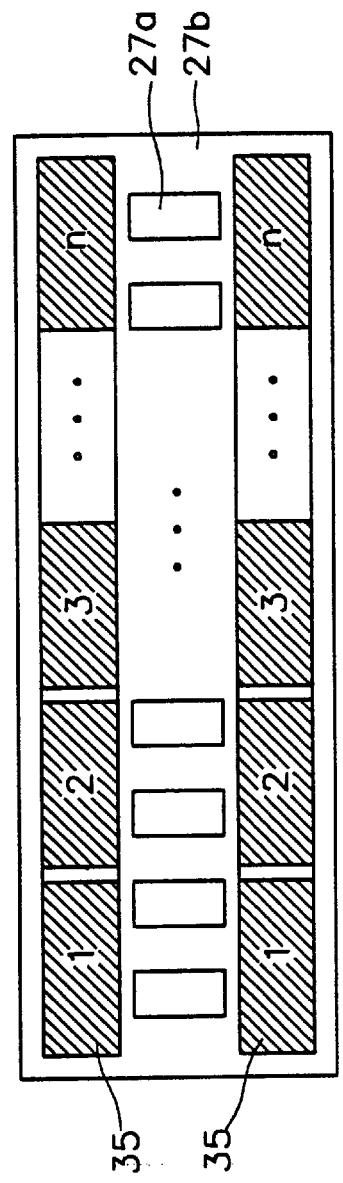
FIG. 6 is a plan view showing another enlarged example of an amplitude mask which can be applied to the long period grating filter manufacturing apparatus of FIG. 2.

FIG. 6 is a plan view showing another enlarged example of the amplitude mask which can be applied to the long period grating filter manufacturing device of FIG. 2. In FIG. 6, reference numerals identical to those of FIG. 4 denote the same elements.

To be specific, the amplitude mask 27 shown in FIG. 6 is different from that of FIG. 4 in that a plurality of (n) piezo-electric transducers 25 are located on the non-transmission area 27b, above and below the transmission area 27a. It is possible to obtain an amplitude mask having various periods when each voltage is applied to the plurality of piezo-electric transducers 35.

The amplitude mask according to the present invention can be used for compensating for the shortcoming that an amplified spontaneous emission (ASE) spectrum of an erbium-doped fiber amplifier (EDFA) cannot be appropriately applied to multiple channel communications since it exhibits fluctuations with respect to wavelength. In other words, it is possible to couple two wavelengths using one amplitude mask by letting the amplitude mask have periods of $\Lambda_1$ and $\Lambda_2$ by applying a voltage of $V_1$ to one piezo-electric transducer and a voltage of $V_2$ to the other piezo-electric transducer of the amplitude mask according to the present invention.

As mentioned above, in the long period grating filter manufacturing apparatus according to the present invention, an amplitude mask having a piezo-electric transducer on a metal substrate, instead of a silica mask having only one period is used. Accordingly, in the long period grating filter manufacturing apparatus of the present invention, the period of the amplitude mask can be controlled. Moreover, in the long period grating filter manufacturing apparatus according to the present invention, it is possible to obtain the effect of a plurality of amplitude masks by employing the amplitude mask having a plurality of piezo-electric transducers on the metal substrate.

What is claimed is:

1. An amplitude mask for use in a long period grating filter manufacturing apparatus comprising:
   a metal substrate having a periodic transmission area with a period for selectively transmitting light and a non-transmission area through which light does not pass; and a piezo-electric transducer located on the non-transmission area of the metal substrate for changing the period of the transmission area.

2. The amplitude mask of claim 1, wherein the periodic transmission area is located on the metal substrate and the piezo-electric transducer is located on opposite sides of the periodic transmission area.

3. The amplitude mask of claim 2, wherein a plurality of piezo-electric transducers are located on the non-transmission area to vary the period of the periodic transmission area.

4. An apparatus for manufacturing a long period grating filter comprising a light source, a lens for controlling focus of light emitted from the light source and an amplitude mask for selectively irradiating with the light, which has passed through the lens, an optical fiber in which the long period grating is formed, wherein the amplitude mask comprises a periodic transmission area having a period for selectively transmitting the light and a non-transmission area through which the light does not pass, located on the metal substrate, and a piezo-electric transducer located on the non-transmission area for changing the period of the periodic transmission area.

5. The apparatus of claim 4, wherein the periodic transmission area is located on the metal substrate and the piezo-electric transducer is located on opposite sides of the periodic transmission area.

6. The apparatus of claim 5, wherein a plurality of piezo-electric transducers are located on the non-transmission area to vary the period of the periodic transmission area.

* * * * *